United States Patent
Honda et al.

(10) Patent No.: US 7,419,613 B2
(45) Date of Patent: Sep. 2, 2008

(54) METHOD AND DEVICE FOR PLASMA-ETCHING ORGANIC MATERIAL FILM

(75) Inventors: Masanobu Honda, Nirasaki (JP); Shoichiro Matsuyama, Nirasaki (JP); Kazuya Nagaseki, Nirasaki (JP); Hisataka Hayashi, Yokohama (JP)

(73) Assignees: Tokyo Electron Limited, Tokyo-To (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/538,064

(22) PCT Filed: Dec. 25, 2003

(86) PCT No.: PCT/JP03/16818

§ 371 (c)(1),
(2), (4) Date: Mar. 7, 2006

(87) PCT Pub. No.: WO2004/061928

PCT Pub. Date: Jul. 22, 2004

(65) Prior Publication Data

US 2006/0213865 A1    Sep. 28, 2006

(30) Foreign Application Priority Data

Dec. 27, 2002    (JP) .............................. 2002-380558

(51) Int. Cl.
*B44C 1/22*    (2006.01)
(52) U.S. Cl. .............................. 216/58; 216/41; 216/58; 216/67; 216/83; 438/637; 438/713; 438/736; 438/778
(58) Field of Classification Search .................... 216/58; 438/736
See application file for complete search history.

(56) References Cited

U.S. PATENT DOCUMENTS 5,272,417 A * 12/1993 Ohmi ..................... 315/111.21

(Continued)

FOREIGN PATENT DOCUMENTS

JP    05-279877    10/1963

(Continued)

OTHER PUBLICATIONS

K. Ono, Pure and Applied Chemistry, vol. 66, No. 6, (1994), pp. 1327-1334.*

(Continued)

*Primary Examiner*—Shamim Ahmed
*Assistant Examiner*—Maki Angadi
(74) *Attorney, Agent, or Firm*—Smith, Gambrell & Russell, LLP

(57) ABSTRACT

A support electrode (2) and a counter electrode (16) constituting parallel plate electrodes are disposed in a process vessel (1). A substrate (W) with an organic material film formed thereon is supported by the support electrode (2). A high-frequency power of a frequency of 40 MHz or above for generating the plasma is applied to the support electrode (2), so that a high-frequency electric field is formed between the support electrode (2) and the counter electrode (16). A process gas is supplied into the process vessel (1) to generate plasma of the process gas by the high-frequency electric field. The organic material film on the substrate (W) is etched with the plasma, with an organic material film serving as a mask. The process gas includes an ionization accelerating gas, such as Ar, that is ionized from a ground state or metastable state with an ionization energy of 10 eV or below and has a maximum ionization cross-section of $2 \times 10^{16}$ $cm^2$ or above.

11 Claims, 12 Drawing Sheets

U.S. PATENT DOCUMENTS

| | | | |
|---|---|---|---|
| 6,593,246 B1 * | 7/2003 | Hasegawa et al. | 438/736 |
| 2002/0042204 A1 | 4/2002 | Hayashi et al. | |
| 2003/0080091 A1 * | 5/2003 | Nakaune et al. | 216/67 |
| 2004/0206725 A1 * | 10/2004 | Fuse et al. | 216/67 |

FOREIGN PATENT DOCUMENTS

| | | |
|---|---|---|
| JP | 03-204925 | 9/1991 |
| JP | 2000-036484 | 2/2000 |
| JP | 2001-060582 | 3/2001 |
| JP | 2001-118825 | 4/2001 |
| JP | 2001-244245 | 9/2001 |
| JP | 2002-270586 | 9/2002 |

OTHER PUBLICATIONS

Translation of International Preliminary Report on Patentability (Form PCT/IPEA/409) (Jan. 2004) issued in connection with PCT/JP2003/016818.

Notification of the Recording of a Change (Corrected Version) From PCT/IGB/306 (Mar. 1994) issued in connection with PCT/JP2003/016818.

Nitification of Transmittal of Copies of Translation of the International Preliminary Report on Patentability (Chapter 1 or Chapter 11) of the Patent Cooperation Treaty (Form PCT/IG/338) (July 1996) issued in connection with PCT/JP2003/016818.

* cited by examiner

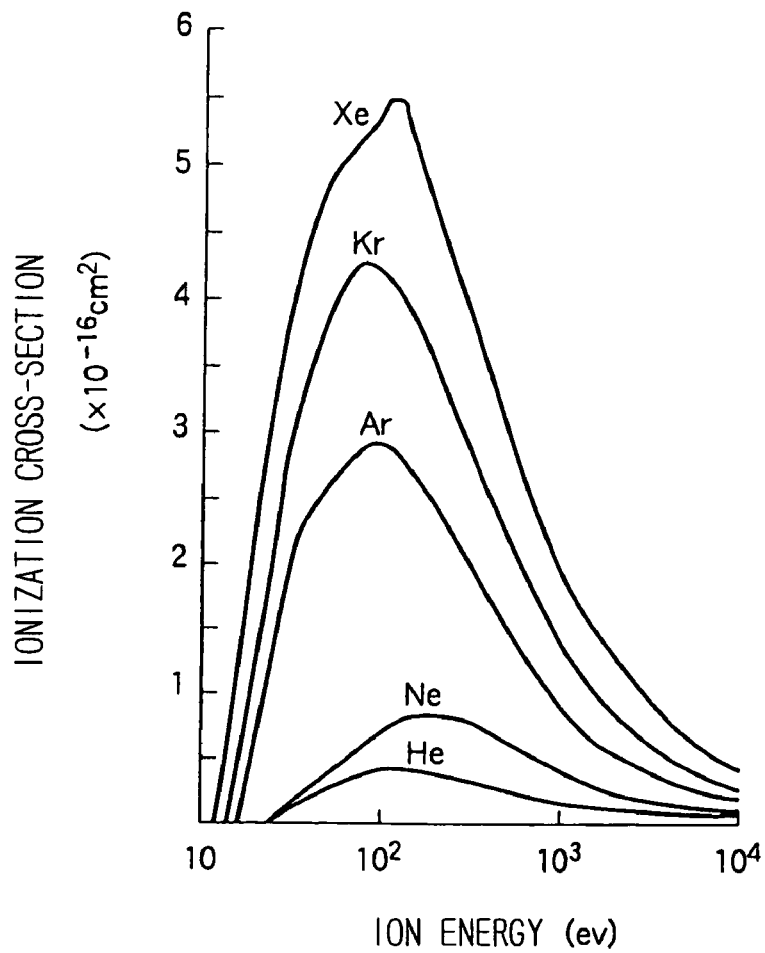
F I G. 4
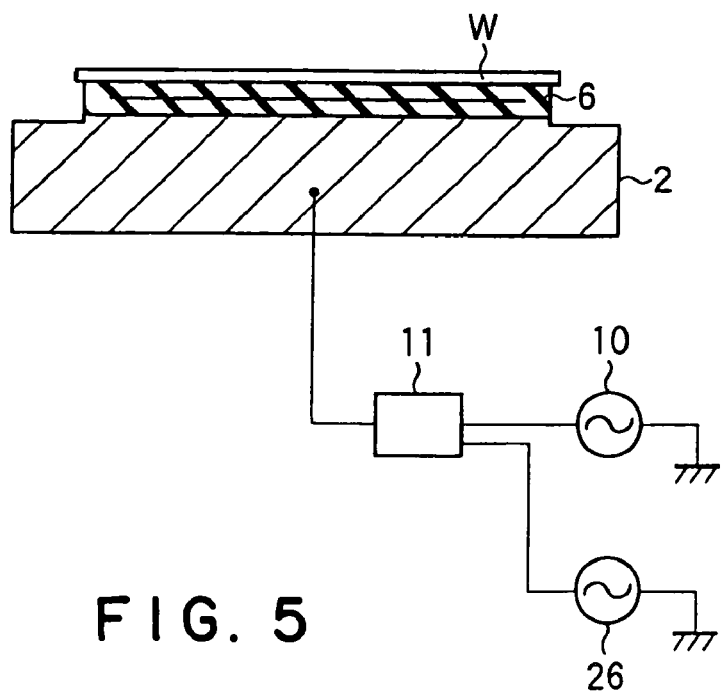
F I G. 5

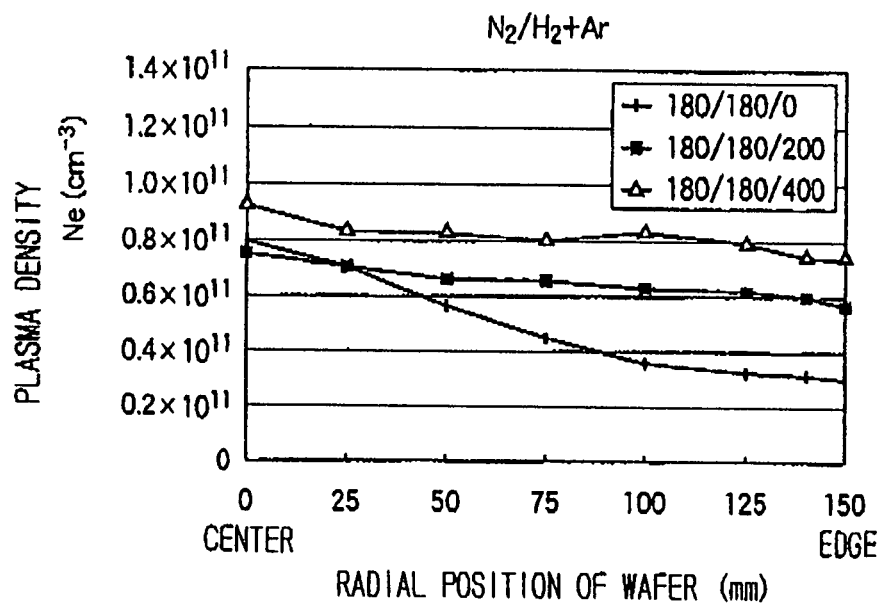
F I G. 11
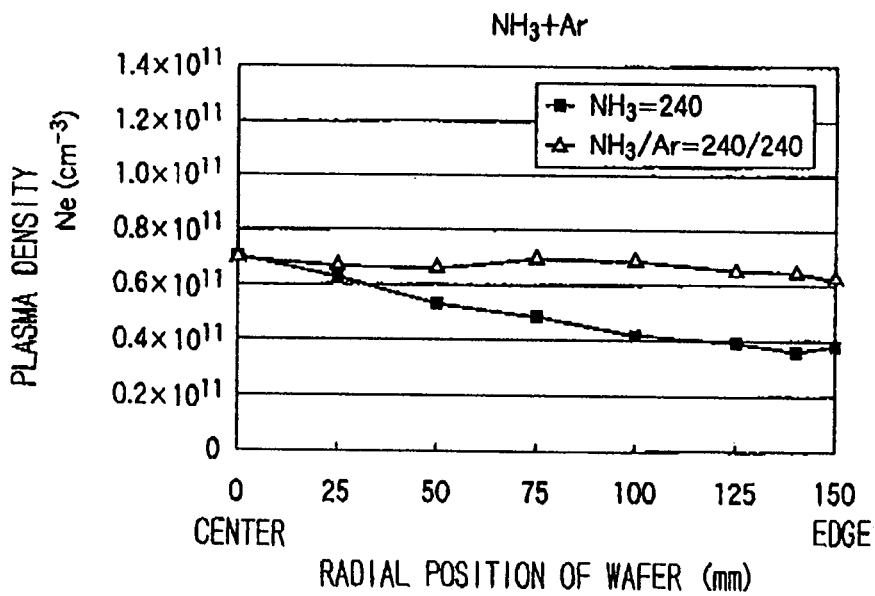
F I G. 12

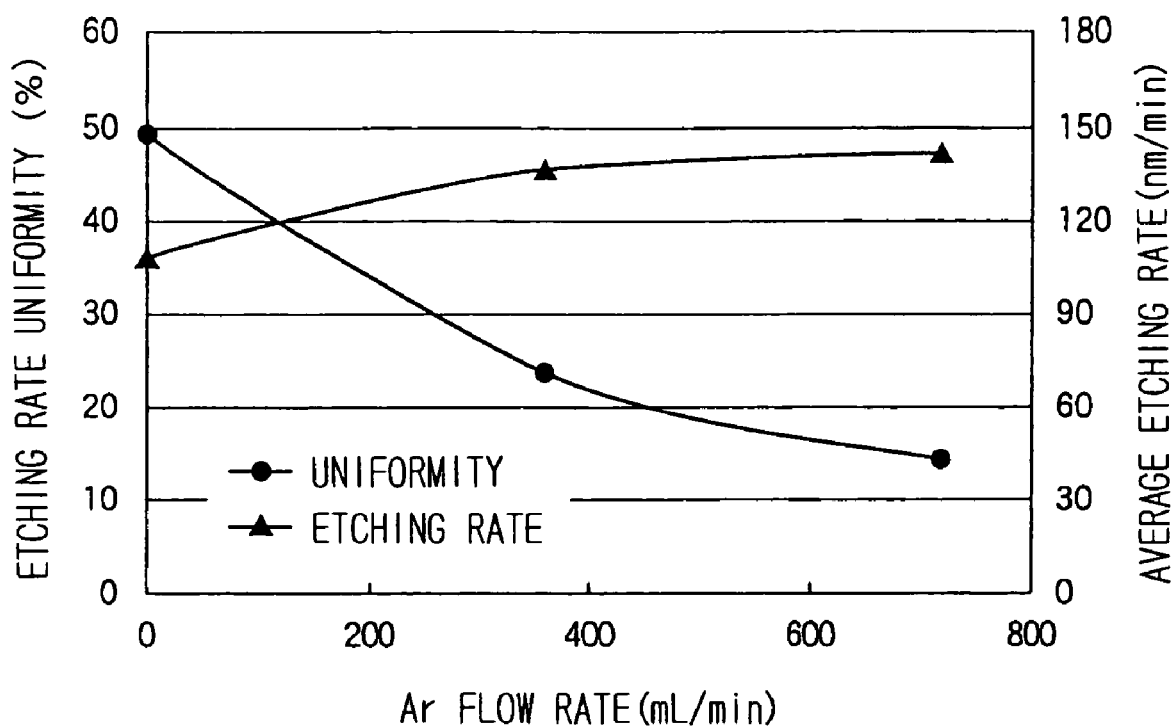
F I G. 14

METHOD AND DEVICE FOR PLASMA-ETCHING ORGANIC MATERIAL FILM

FIELD OF THE INVENTION

The present invention relates to a method and apparatus for plasma-etching an organic material film such as a low dielectric constant film (low-k film) formed on a substrate of a semiconductor wafer or the like.

BACKGROUND ART

In a wiring process of a semiconductor device, an interlayer dielectric film disposed between wiring layers is etched for conducting the wiring layers. In view of the recent demand for higher speed of a semiconductor device, an interlayer dielectric film has been required to have a lower dielectric constant, and an organic material film has been used as such a low dielectric constant film.

An organic material film is etched with plasma, using an inorganic material film, such as silicon oxide, as a mask. To be specific, as disclosed in Japanese Patent Laid-Open Publications No. 2001-60582 and No. 2001-118825, the plasma-etching process is carried out by means of a plasma-etching apparatus, in which a pair of parallel plate electrodes facing vertically each other are disposed in a process vessel. A semiconductor wafer (hereinafter referred to simply as "wafer") is placed on a lower electrode (support electrode) which is one of the pair of parallel plate electrodes, and a high-frequency power of a frequency of 13.56 MHz is supplied to the support electrode. A gas including $N_2$, $H_2$, Ar and the like is supplied as a process gas to the process vessel.

The conventional plasma-etching process of an organic material film carried out under the above-described conditions has the following disadvantages. That is, when a plasma density is increased for a higher etching rate, a self-bias voltage of the electrode is also increased. Thus, a facet formation of an inorganic material film, which is disposed adjacent to the organic material film to serve as a mask, is damaged by drawn ions, resulting in a deterioration in etching selectivity of the organic material film relative to the inorganic material film. Namely, a high etching rate and a high etching selectivity cannot be simultaneously attained.

A possible method of etching an organic material film with a high selectivity while preventing such a facet formation damage is to use a molecular single gas or mixed gas, excluding an atomic gas such as Ar gas having a high etching action (high sputtering action). This method is, however, disadvantageous in terms of a considerably degraded uniformity in electron density (plasma density), in accordance with an electric field strength distribution. That is, a center portion of the substrate has a higher electron density, while an edge portion thereof has a lower electron density. Therefore, a resulting etching uniformity is unavoidably lowered. In particular, when a wafer has a large diameter of, e.g., 300 mm, such non-uniformity in the electron density (plasma density) is noticeably deteriorated.

DISCLOSURE OF THE INVENTION

The present invention has been made in view of the above context. An object of the present invention is to provide a method and apparatus for plasma-etching an organic material film, capable of achieving both a high selectivity relative to an adjacent inorganic material film, and a high uniformity in electron density or plasma density.

The inventors have found that, in an etching process of an organic material film, a plasma density has a dominant impact on the process, while an ion energy makes only a small contribution to the process. On the other hand, in an etching process of an inorganic material film, both the plasma density and ion energy are important. Thus, it was found that, in order to increase an etching selectivity of an organic material film relative to an inorganic material film without lowering an etching rate of the organic material film, an ion energy should be lowered while preventing a lowering of a plasma density. An ion energy of plasma can be indirectly grasped through a self-bias voltage of an electrode during the etching process. Thus, an organic material film should be etched under a low self-bias voltage condition without lowering a plasma density, in order that the organic material film is etched with a high etching selectivity without lowering an etching rate of the organic material film. A further investigation by the inventors has shown that, when a frequency of a high-frequency power to be applied to an electrode is raised, the electrode can have a low self-bias voltage, without lowering a plasma density.

It was also found that, in an etching process where a frequency of a high-frequency power for generating plasma is increased as high as 40 MHz or above, even when an atomic gas such as Ar gas is used as a process gas, the gas does not exert a high etching performance, because of a low self-bias voltage of the electrode. Rather, use of a gas that is ionized with a low energy, or a gas that has a large ionization cross-section, such as Ar gas, can provide a uniform electron density or plasma density.

In a first aspect of the present invention, there is provided a method of plasma-etching an organic material film formed on a substrate with an inorganic material film used as a mask, by means of a parallel plate type plasma-etching apparatus; wherein the organic material film is plasma-etched with a high-frequency power of a frequency of 40 MHz or above for generating plasma; and a process gas including an ionization accelerating gas that is ionized from a ground state or metastable state with an ionization energy of 10 eV or below and has a maximum ionization cross-section of $2 \times 10^{-16}$ cm$^2$ or above, and a molecular gas.

According to this method, since a frequency of a high-frequency power for generating the plasma is raised to 40 MHz or above, which is higher than a conventional one, a low self-bias voltage can be realized while maintaining a plasma density required for etching an organic material film, so that the organic material film can be etched with a high etching selectivity relative to an inorganic material film. Use of a process gas including an ionization accelerating gas represented by Ar, Xe, or Kr, that is ionized from a ground state or metastable state with an ionization energy of 10 eV or below and has a maximum ionization cross-section of $2 \times 10^{-16}$ cm$^2$ or above, and a molecular gas, can significantly improve a plasma distribution, without degrading a plasma density (electron density). That is, since a gas, that is ionized from a ground state or metastable state with an ionization energy of 10 eV or below and has a maximum ionization cross-section of $2 \times 10^{-16}$ cm$^2$ or above, can be easily ionized, addition of such gas accelerates an ionization of the process gas. Thus, the process gas can be sufficiently ionized near an edge portion of a substrate where an electric field strength is relatively low, whereby the process gas can be uniformly ionized as a whole. As a result, a uniform electron density or plasma density can be attained.

Specifically, the method can be carried out by means of a plasma-etching apparatus including a process vessel into which the process gas is supplied, and parallel plate electrodes disposed in the process vessel, the electrodes being constituted by a support electrode on which the substrate is supported, and a counter electrode that is opposed to the support electrode. By applying a high-frequency power (frequency of 40 MHz or above) for generating the plasma to the support electrode, an organic material film can be etched with less damage to an inorganic material film, due to a low self-bias voltage of the support electrode. If an absolute value of a self-bias voltage of the support electrode is 500 V or below, a high-frequency power of a frequency of 500 kHz to 27 MHz for drawing ions to a substrate may be applied to the support electrode. Owing thereto, an etching property can be enhanced by drawing ions within a degree where the ions do not damage the inorganic material film.

When a high-frequency power (frequency of 40 MHz or above) for generating the plasma is applied to the counter electrode (not the support electrode), it is necessary to apply, to the support electrode, a high-frequency power (frequency of 500 kHz to 27 MHz) for drawing ions to a substrate. Also in this case, an absolute value of a self-bias voltage of the support electrode is made 500 V or below, so as to suppress damage to the inorganic material film.

It is preferable to use any one of Ar, Xe, and Kr, as a gas that is ionized from a ground state or metastable state with an ionization energy of 10 eV or below and has a maximum ionization cross-section of $2\times10^{-16}$ cm$^2$ or above. In particular, Ar is most effective in that Ar has a metastable state and makes transition therefrom to an ionized state with an energy of about 4 eV, and has a larger maximum ionization cross-section. Moreover, Ar is the most inexpensive of these gases. Each of Xe and Kr has also a metastable state and makes transition therefrom to an ionized state with a low energy, and have a large maximum ionization cross-section. Specifically, a process gas including Ar as the ionization accelerating gas, and $N_2$ and $H_2$ as the molecular gases, or a process gas including Ar as the ionization accelerating gas and $NH_3$ as the molecular gas can be used.

A frequency of the high-frequency power for generating the plasma is preferably 40 MHz or above, and a frequency of 100 MHz is most preferred.

A distance between the support electrode and the counter electrode in the parallel plate electrodes (distance between the electrodes) is preferably 40 mm or below, for the following reason. That is, according to the Paschen's law, a discharge inception voltage Vs takes a minimum value (Paschen minimum value) when a product pd (product of p and d) of a gas pressure p and the distance d between the electrodes takes a certain value. The more a frequency of a high-frequency power is raised, the smaller the value of pd which determines the Paschen minimum value becomes. Thus, in a case where a frequency of a high-frequency power is relatively high, as in the present invention, the distance d between the electrodes should be reduced when the gas pressure p is constant, in order to lower the discharge inception voltage Vs to facilitate a stable electric discharge. Therefore, in the present invention, it is preferable that the distance between the electrodes be 40 mm or below. When the distance between the electrodes is 40 mm or below, a residence time of the gas in the process vessel can be shortened. Thus, a reaction product can be efficiently discharged from the process vessel, which suppresses an etching stop.

From the same viewpoint, in a second aspect of the present invention, there is provided an apparatus for plasma-etching an organic material film formed on a substrate with an inorganic material film used as a mask, comprising:

a process vessel that contains the substrate;

parallel plate electrodes disposed in the process vessel, the electrodes being constituted by a support electrode on which the substrate is supported, and a counter electrode that is opposed to the support electrode;

a process gas supply system that supplies a process gas into the process vessel;

an evacuating system that evacuates an atmosphere of the process vessel; and a first high-frequency power source that supplies a high-frequency power for generating plasma to the support electrode; wherein the first high-frequency power source supplies a high-frequency power of a frequency of 40 MHz or above; and the process gas supply system supplies a process gas including an ionization accelerating gas that is ionized from a ground state or metastable state with an ionization energy of 10 eV or below and has a maximum ionization cross-section of $2\times10^{-16}$ cm$^2$ or above, and a molecular gas.

Further, in the second aspect of the present invention, there is provided an apparatus for plasma-etching an organic material film formed on a substrate with an inorganic material film used as a mask, comprising:

a process vessel that contains the substrate;

parallel plate electrodes disposed in the process vessel, the electrodes being constituted by a support electrode on which the substrate is supported, and a counter electrode that is opposed to the support electrode;

a process gas supply system that supplies a process gas into the process vessel;

an evacuating system that evacuates an atmosphere of the process vessel;

a first high-frequency power source that supplies a high-frequency power for generating plasma to the counter electrode; and a second high-frequency power source that supplies a high-frequency power for drawing ions to the support electrode; wherein the first high-frequency power source supplies a high-frequency power of a frequency of 40 MHz or above;

the second high-frequency power source supplies a high-frequency power of a frequency of 500 kHz to 27 MHz, such that an absolute value of the self-bias voltage of the support electrode is 500 V or below; and the process gas supply system supplies a process gas including an ionization accelerating gas that is ionized from a ground state or metastable state with an ionization energy of 10 eV or below and has a maximum ionization cross-section of $2\times10^{-16}$ cm$^2$ or above, and a molecular gas.

BRIEF DESCRIPTION OF THE DRAWINGS

FIG. 4 is a view showing the relationship between an electron energy of each rare gas and an ionization cross-section thereof;

FIG. 5 is a schematic sectional view partially showing the plasma-etching apparatus in which a high-frequency power source for plasma generation and a high-frequency power source for ion drawing are connected to a support table serving as a support electrode;

FIG. 11 is a view showing the relationship between a radial position of a wafer 300 mm in diameter and a plasma density, when $N_2/H_2$ is used as a process gas, and when $N_2/H_2$ with Ar added thereto is used as a process gas;

FIG. 12 is a view showing the relationship between a radial position of a wafer 300 mm in diameter and a plasma density, when $NH_3$, which is a conventional process gas, is used as a process, and when $NH_3$ with Ar added thereto is used as a process gas;

FIG. 14 is view showing the relationship between an flow rate of Ar and an etching uniformity in a radial direction of the wafer, and the relationship between a flow rate of Ar and an average etching rate.

BEST MODE FOR CARRYING OUT THE INVENTION

An embodiment of the present invention will be described below with reference to the accompanying drawings.

Figure 1:
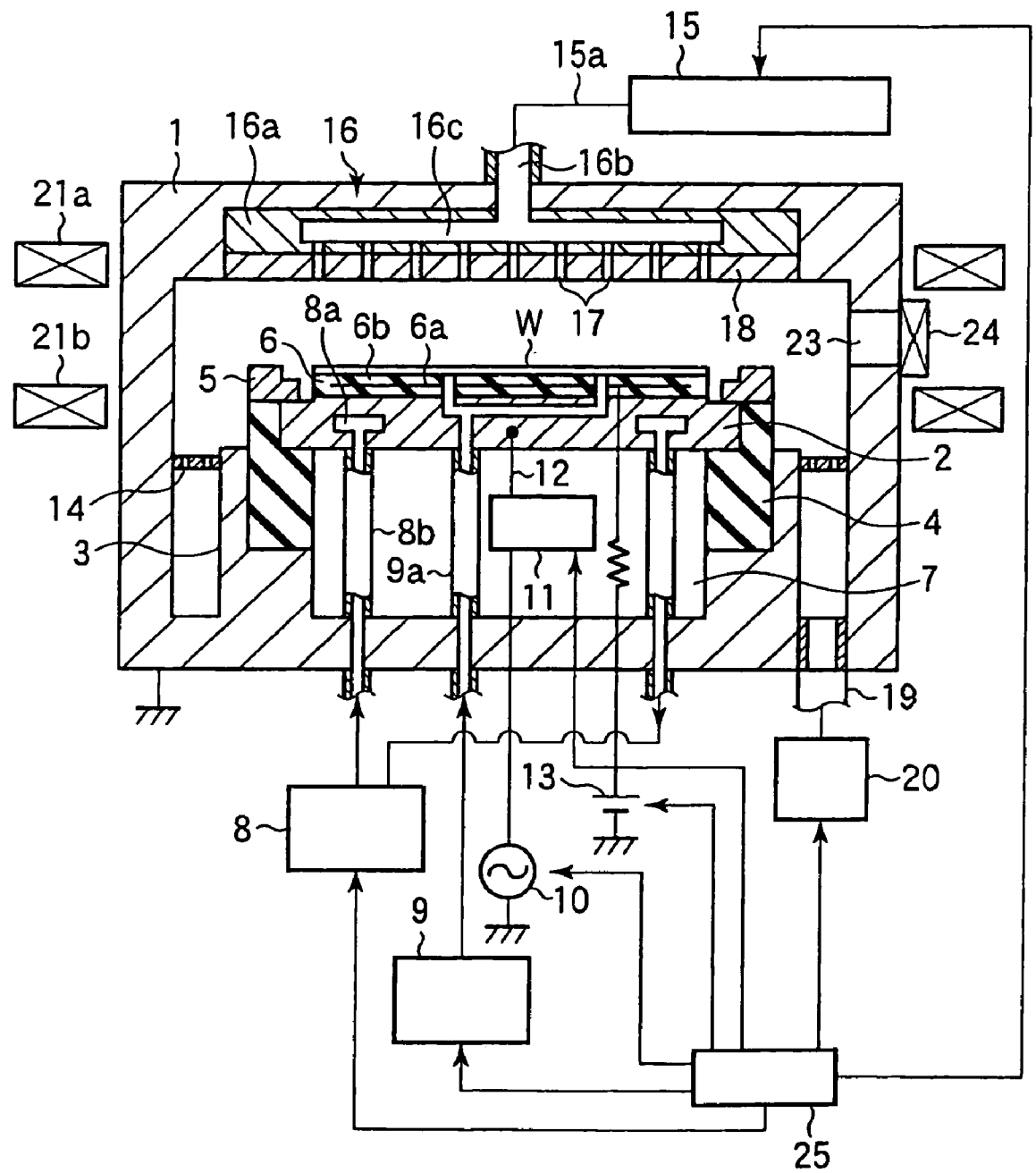
FIG. 1 is a sectional view of a plasma-etching apparatus in one embodiment of the present invention.

FIG. 1 is a sectional view of a plasma-etching apparatus for use in carrying out the present invention. The etching apparatus includes an air-tight, almost cylindrically-shaped process vessel 1 made of, e.g., aluminum. A wall surface of the process vessel 1 is oxidized. The process vessel 1 is grounded.

In the process vessel 1, there is disposed a support table 2 that horizontally supports a wafer W as a substrate, and serves as a support electrode (lower electrode). The table 2 is made of, e.g., aluminum and its surface is oxidized. The table 2 is supported by a support unit 3 projecting from a bottom wall of the process vessel 1 through an insulation member 4. A focus ring 5 made of a conductive material or insulative material is disposed to correspond to an upper periphery of the table 2. When a diameter of the wafer W is 300 mmφ, the focus ring 5 having a diameter of from 340 mmφ to 380 mmφ is employed. A baffle plate 14 is disposed outside the focus ring 5. A cavity 7 is formed between the table 2 and the bottom wall of the process vessel 1.

An electrostatic chuck 6 is disposed on a front surface of the table 2, that electrostatically attracts and holds the wafer W. The electrostatic chuck 6 is constituted by insulators 6b and an electrode 6a interposed therebetween. A direct-current power source 13 is connected to the electrode 6a. When a voltage is applied to the electrode 6a from the power source 13, the semiconductor wafer W is attracted and held by the electrostatic chuck 6 by Coulomb force.

The table 2 has therein a coolant channel 8a to which a coolant piping 8b is connected. A suitable coolant is supplied to the coolant channel 8a through the coolant piping 8b by a coolant control apparatus 8, and the coolant circulates in the coolant channel 8a. Thus, a temperature of the table 2 can be suitably controlled. A heat-transfer gas piping 9a for supplying a heat-transfer gas, such as He gas, that transfers heat, is disposed between a front surface of the electrostatic chuck 6 and a rear surface of the wafer W. A heat-transfer gas can be supplied to the rear surface of the wafer W from a heat-transfer gas supply apparatus 9 through the heat-transfer gas piping 9a. Thus, even when an atmosphere of the process vessel 1 is evacuated and maintained in a vacuum, a cooled temperature of the coolant circulating in the coolant channel 8a can be effectively transferred to the wafer W, so that a temperature-controllability of the wafer W can be enhanced.

A feeding line 12 for supplying a high-frequency power is connected to substantially a center portion of the table 2. A matching apparatus 11 and a high-frequency power source 10 are connected to the feeding line 12. A high-frequency power of a predetermined frequency can be supplied to the table 2 from the high-frequency power source 10.

A showerhead 16 is disposed to face the table 2 serving as a support electrode in parallel with each other. The showerhead 16 is grounded through the process vessel 1. Thus, the showerhead 16 serves as a counter electrode (upper electrode), so that the showerhead 16 and the table 2 constitute the pair of parallel plate electrodes.

A distance between the table (support electrode) 2 and the showerhead (counter electrode) 16 (distance between the electrodes) in the pair of parallel plate electrodes is preferably 40 mm or below, for the following reason. That is, according to the Paschen's law, a discharge inception voltage Vs takes a minimum value (Paschen minimum value) when a product pd of a gas pressure p and the distance d between the electrodes takes a certain value. The more the frequency of a high-frequency power is raised, the smaller the value of pd which determines the Paschen minimum value becomes. Thus, in a case where a frequency of a high-frequency power is relatively high, as in the present invention, the distance d between the electrodes should be reduced when the gas pressure p is constant, in order to lower the discharge inception voltage Vs to facilitate a stable electric discharge. Therefore, in the present invention, it is preferable that the distance between the electrodes be 40 mm or below. When the distance between the electrodes is 40 mm or below, a residence time of a gas in the process vessel can be shortened. Thus, a reaction product can be efficiently discharged from the process vessel 1, which suppresses an etching stop.

The showerhead 16 is fitted in a top wall of the process vessel 1. The showerhead 16 includes a showerhead body 16a and an exchangeable electrode plate 18 disposed on a lower surface of the showerhead body 16a. A plurality of gas discharging holes 17 are provided to pass through a lower part of the showerhead body 16a and the electrode plate 18. The showerhead 16 is provided with a gas inlet part 16b positioned above the showerhead body 16a. A space 16c is formed inside the showerhead 16. One end of a gas supply piping 15a is connected to the gas inlet part 16b. To the other end of the gas supply piping 15a, there is connected a process gas supply apparatus 15 that supplies a process gas for etching.

A process gas for etching is obtained by adding an ionization accelerating gas to a molecular gas such as $N_2$, $H_2$, $O_2$, CO, $NH_3$, $C_xH_y$ (in which x and y are natural numbers). The term "ionization accelerating gas" means a gas that is ionized from a ground state or metastable state with an ionization energy of 10 eV or below and has a maximum ionization cross-section of $2\times10^{-16}$ cm$^2$ or above. By adding such an ionization accelerating gas, a plasma distribution can be significantly improved, without lowering a plasma density (electron density).

Figure 3:
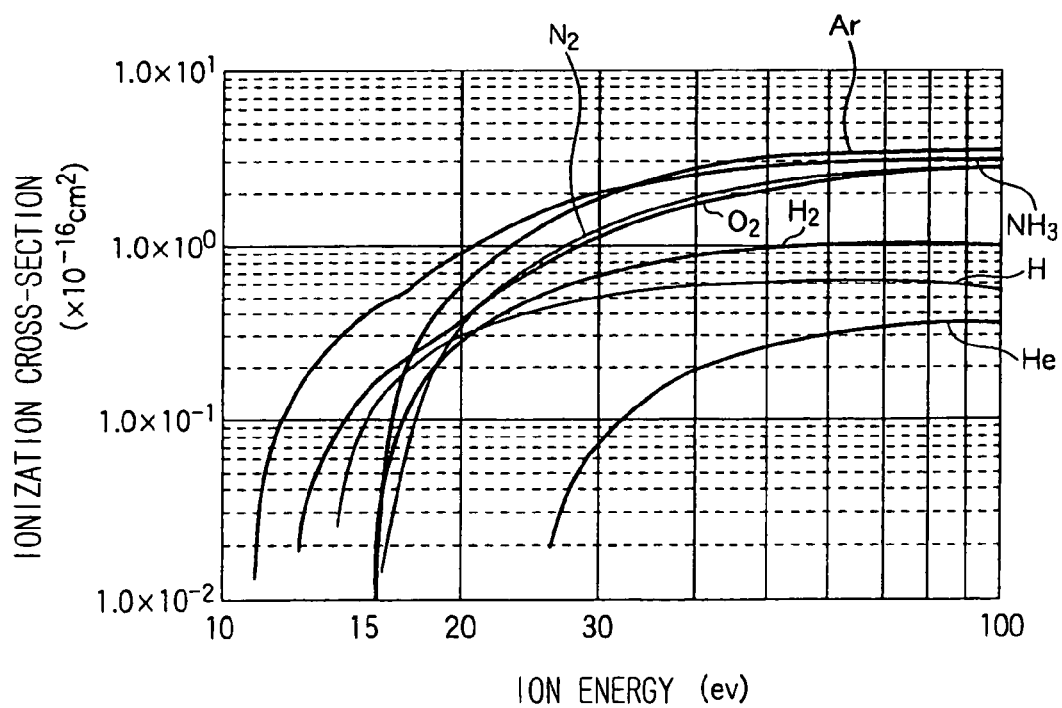
FIG. 3 is a view showing the relationship between an electron energy of each gas and an ionization cross-section thereof.

The ionization accelerating gas is preferably Ar, Xe, or Kr. Of these gases, Ar is particularly preferred. When Ar is ionized from its ground state, an ionization energy of 15.8 eV is required, which value is not so different from that of an ionization energy of the molecular gas such as $N_2$ and $H_2$. However, Ar has metastable states which can be maintained for about five seconds at the energy levels of 11.55 eV and 11.72 eV from the ground state. Ar can make transition from the metastable states to the ionized state with an energy of about 4 eV. In addition, As shown in FIG. 3, the maximum ionization cross-section of Ar is about $3\times10^{-16}$ cm$^2$, which is larger than that of the molecular gas such as $N_2$ and $H_2$. Thus, addition of Ar to the process gas remarkably accelerates an ionization of the process gas. Xe and Kr also have metastable states and make transition therefrom to the ionized state with relatively low energies. In addition, as shown in FIG. 4, Xe and Kr have a maximum ionization cross-section larger than that of Ar. As shown in FIG. 4, although a rare gas similar to the above gases, He and Ne have a smaller maximum ionization cross-section. Further, He and Ne require a larger ionization energy. For example, He is ionized from the ground state with an ionization energy of 24.6 eV.

A molecular gas may be a combination of $N_2$ and $H_2$, $NH_3$, a combination of these gases and $O_2$, a combination of $N_2$ and $O_2$, and a combination of $CH_4$ or $C_2H_6$ and $O_2$, for example. Of these, the combination of $N_2$ and $H_2$, and $NH_3$ are preferred. Thus, as a process gas, it is preferable that Ar be added to the combination of $N_2$ and $H_2$, and that Ar be added to $NH_3$. A preferable flow-rate ratio of the ionization accelerating gas relative to the molecular gas in the process gas is 0.5 or above.

Such a process gas is supplied from the process gas supply apparatus 15 through the gas supply piping 15a and the gas inlet part 16b to reach the space 16c in the showerhead body 16a. Then, the process gas is discharged from the gas discharge holes 17 so as to be used for etching a film formed on the wafer W.

An evacuating pipe 19 is connected to the bottom wall of the process vessel 1. An evacuating apparatus 20 including a vacuum pump and the like is connected to the evacuating pipe 19. By operating the vacuum pump in the evacuating apparatus 20, a pressure in the process vessel 1 can be reduced to a predetermined vacuum degree. The process vessel 1 is provided with, on its upper part of a sidewall, a gate valve 24 that opens and closes a port 23 through which the wafer W is loaded into the process vessel 1 and unloaded therefrom.

Two ring magnets 21a and 21b are disposed to concentrically surround the process vessel 1, with the loading/unloading port 23 being vertically intervened therebetween. Thus, a magnetic field is formed around a process space between the table 2 and the showerhead 16. The ring magnets 21a and 21b can be rotated by a rotating mechanism, not shown.

Figure 2:
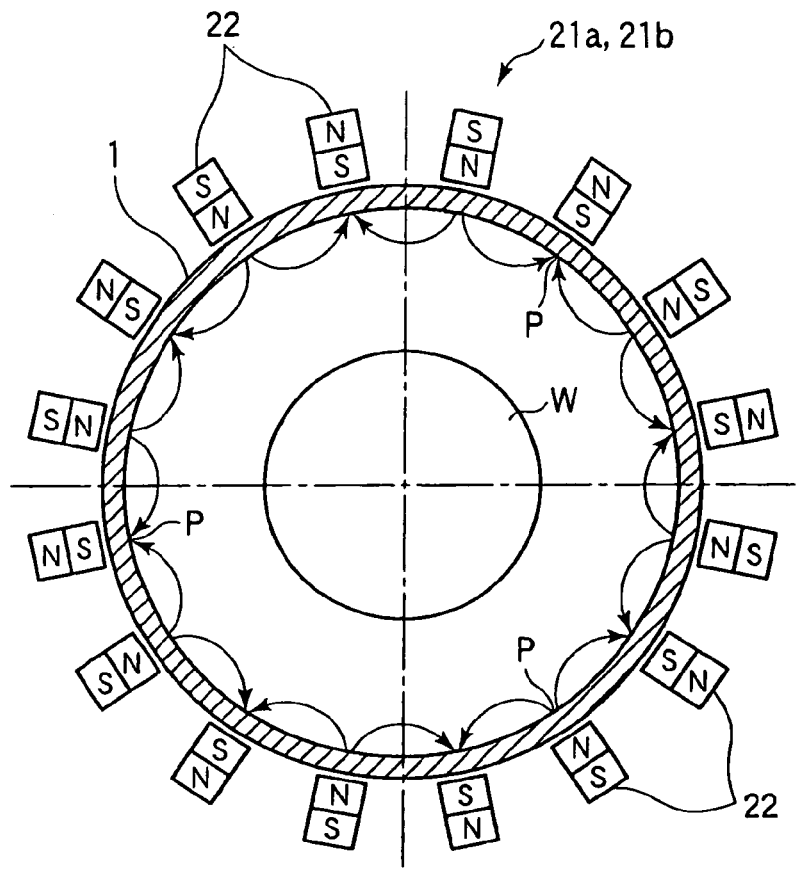
FIG. 2 is a horizontal sectional view schematically showing a ring magnet arranged around a process vessel in the apparatus shown in FIG. 1.

As shown in the horizontal sectional view of FIG. 2, each of the ring magnets 21a and 21b is constituted by a plurality of segment magnets 22 which are supported by a support member, not shown, to form a ring shape. In this example, the sixteen segment magnets 22 are annularly (concentrically) arranged in a multipole condition. That is, in the ring magnets 21a and 21b, the plurality of segment magnets 22 are arranged such that an magnetic orientation of the certain segment magnet 22 is converse to an magnetic orientation of the adjacent segment magnet 22. Thus, as shown in FIG. 2, a magnetic line is formed between the segment magnets 22 adjacent to each other, so that a magnetic field of 0.02 to 0.2 T (200 to 2000 Gauss), preferably 0.03 to 0.045 T (300 to 450 Gauss) is formed only on the peripheral portion of the process space, while a place where the wafer W is located is in substantially a non-magnetic field condition. Since an excessively high magnetic field strength causes a leakage of magnetic field, and an excessively low magnetic field strength interferes a plasma confinement effect, the range of the magnetic field strength is defined as above. Note that, however, a proper range of the magnetic field strength varies depending on a structure of the apparatus.

When such a magnetic field is formed on the peripheral portion of the process space, it is preferable that a magnetic field strength on the focus ring 5 be 0.001 T (10 Gauss) or above. This causes a drift motion of electrons (E×B drift) on the focus ring 5 to increase a plasma density on the edge portion of the wafer, so that the plasma density becomes uniform. From the standpoint of avoidance of charge-up damage of the wafer W, a preferable magnetic field strength of the place where the wafer W is situated is 0.001 T (10 Gauss) or below.

A substantially non-magnetic field condition of the place where the wafer W is located includes not only a condition where there is absolutely no magnetic field, but also a condition where there is a magnetic field in the place where the wafer is located without an impact on an etching process so that substantially no impact is given to the wafer process.

When the magnetic field is formed by the ring magnet in the multipole condition, there is concern that a part of the wall of the process vessel 1 corresponding to a magnetic pole (part indicated by P in FIG. 2, for example) might be locally etched. However, since the ring magnets 21a and 21b are rotated along a circumference of the process vessel 1 by the not-shown rotating mechanism, the magnetic pole is prevented from being locally in contact with the wall of the process vessel 1. Thus, it can be avoided that the wall of the process vessel 1 is locally etched.

Each of the segment magnets 22 can be rotated about a vertical axis by a segment magnet rotating mechanism, not shown. By rotating the segment magnets 22, a condition where a multipole magnetic field is substantially formed can be changed into a condition where no multipole magnetic field is formed, and vice versa. Since condition where the multipole magnetic field is formed and the condition where no multipole magnetic field is formed can be changed to each other, a suitable one can be selected, in accordance with a case whether or not the multipole magnetic field effectively actions on the wafer process.

Since a condition of the magnetic field varies depending on an arrangement of the segment magnets, various magnetic field strength profiles can be formed by varying an arrangement of the segment magnets. Thus, it is preferable that the segment magnets be arranged so as to obtain a required magnetic field strength profile.

The number of segment magnets is not limited to the above example. Also, the cross-section shape of the segment magnet is not limited to a rectangular shape as shown in this embodiment. For example, the segment magnet can have any cross-section shape, such as circle, square, and trapezium. In addition, a magnetic material for forming the segment magnet 22 is not specifically limited, and any publicly-known magnetic material can be used, such as a rare-earth group magnet, ferrite group magnet, and Alnico magnet.

In order to adjust a plasma density and an ion drawing action, it is possible to superpose a high-frequency power for generating the plasma and a high-frequency power for drawing ions in plasma. Specifically, as shown in FIG. 5, in addition to the high-frequency power source 10 for plasma generation, a high-frequency power source 26 for ion drawing is connected to the matching apparatus 11, so that both high-frequency powers can be superposed. In this constitution, a frequency of the high-frequency power source 26 for ion drawing is preferably in a range of from 500 kHz to 27 MHz. This range of frequency can further increase an etching rate of an organic material film by controlling an ion energy. In this case, a high-frequency power is supplied from the high-frequency power source 26 for ion drawing to the table 2 serving as a support electrode, such that an absolute value of the self-bias voltage Vdc of the table 2 is 500 V or below. More preferably, an absolute value of the self-bias voltage Vdc is 200 V or below.

Figure 6:
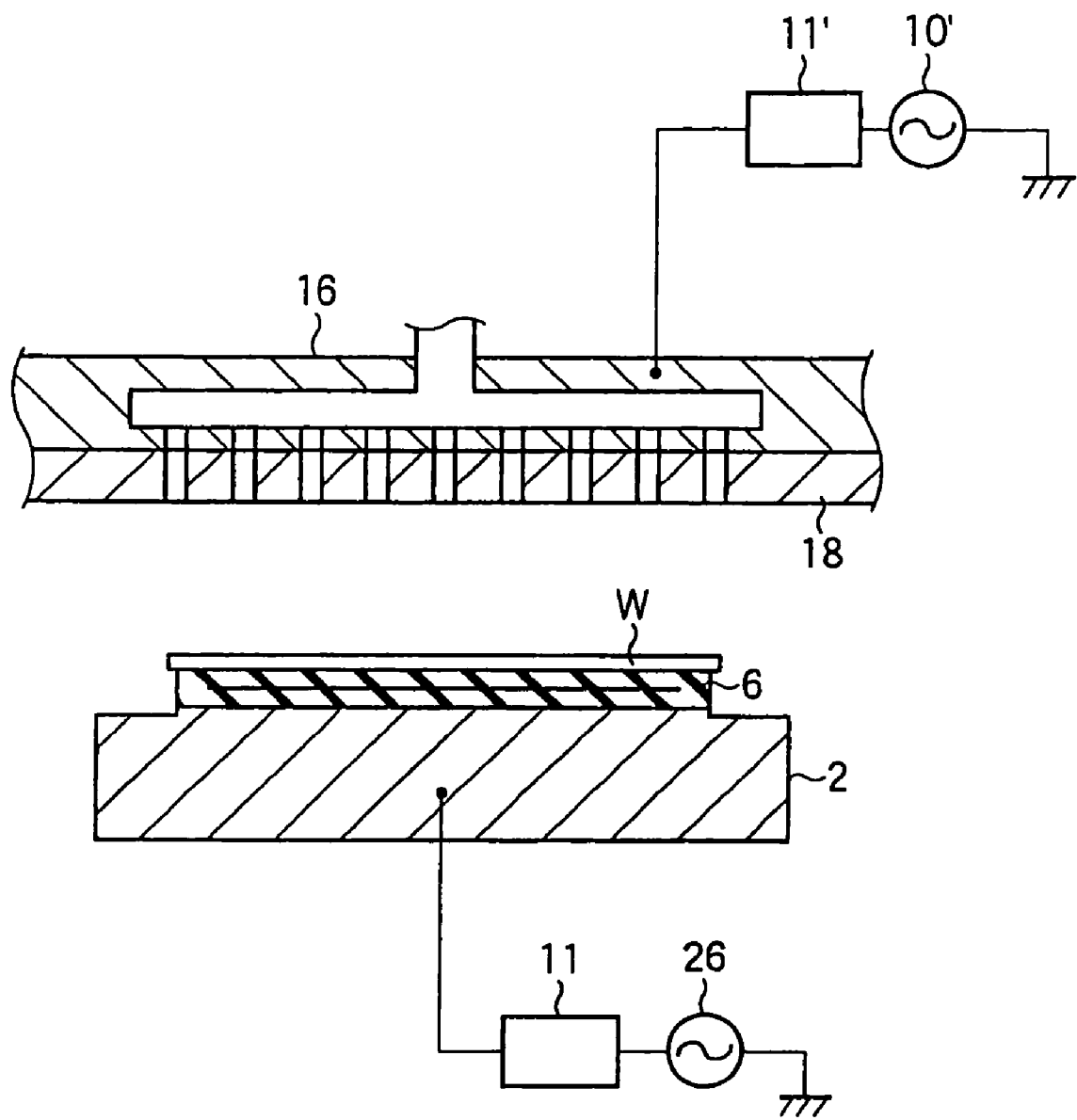
FIG. 6 is a schematic sectional view partially showing the plasma-etching apparatus in which a high-frequency power source for plasma generation is connected to a showerhead serving as a counter electrode, and the high-frequency power source for ion drawing is connected to the support table.

As shown in FIG. 6, a high-frequency power source 10' for plasma generation may be connected to the showerhead 16 serving as a counter electrode through a matching apparatus 11', so that only the high-frequency power source 26 for ion drawing is connected to the support table 2 serving as a support electrode through the matching apparatus 11. In this constitution, unless the table 2 is biased, an etching process cannot be carried out. Thus, the high-frequency power source 26 for ion drawing is indispensable. Similar to the above, a high-frequency power is supplied from the high-frequency power source 26 for ion drawing to the table 2 serving as a support electrode, such that an absolute value of the self-bias voltage Vdc of the table 2 is 500 V or below. More preferably, an absolute value of the self-bias voltage Vdc is 200 V or below.

The high-frequency power source 10, the matching apparatus 11, the direct-current power source 13, the process gas supply apparatus 15, the coolant control apparatus 8, the heat-transfer gas supply apparatus 9, and the evacuating apparatus 20 are controlled by a control unit 25.

Next, an etching process of a low dielectric constant film (low-k film) as an organic material film with a use of an inorganic material film as a mask, which process is carried out by the plasma-etching apparatus as constituted above, is described below.

Figure 7A:
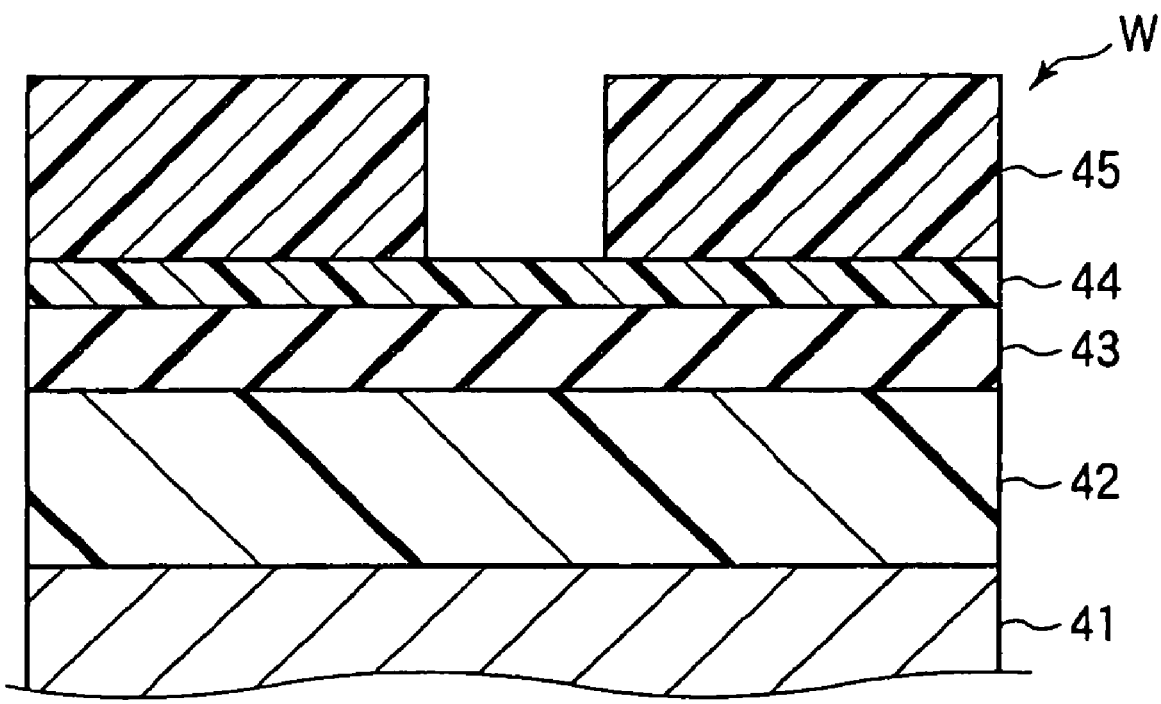
FIGS. 7a and 7b are sectional views each showing an example of a structure of a wafer to which the plasma-etching process of the present invention is applied.

As shown in FIG. 7a, the wafer W, which is not yet subjected to an etching process, includes: a silicon substrate 41; an organic material film 42 formed on the substrate 41, the organic material film 42 being a low-k film serving as an interlayer dielectric film; an inorganic material film 43 formed on the organic material film 42, the inorganic material film 43 having a predetermined pattern and serving as a hardmask; a BARC layer 44 formed on the inorganic material film 43; and a resist film 45 of a predetermined pattern formed on the BARC layer 44.

The inorganic material film 43 is formed of a material generally for use in a hardmask. For example, silicon oxide, silicon nitride, and silicon nitride oxide are taken as suitable examples.

The organic material film 42 to be etched is a low-k film used as an interlayer dielectric film, which is as stated above. A dielectric constant of the organic material film 42 is significantly smaller than that of silicon oxide which is a conventional material of an interlayer dielectric film. The inorganic material low-k film may be formed of, for example, a bis-benzo cyclobutene resin (BCB), a polyarylene ether resin (PAE) such as SiLK (trade name) and FLARE (trade name) manufactured by the Dow Chemical Co., and an organic polysiloxane resin such as methylsilsesquioxane (MSQ). Herein, organic polysiloxane means a compound having a structure including a functional group including C and H in a bonding structure of a silicon oxide film. In the structure shown below, R indicates an alkyl group such as a methyl group, ethyl group, and propyl group, or its derivative; or an aryl group such as a phenyl group, or its derivative.

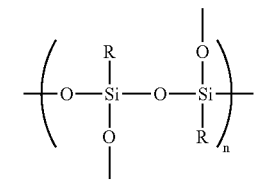

Figure 7B:
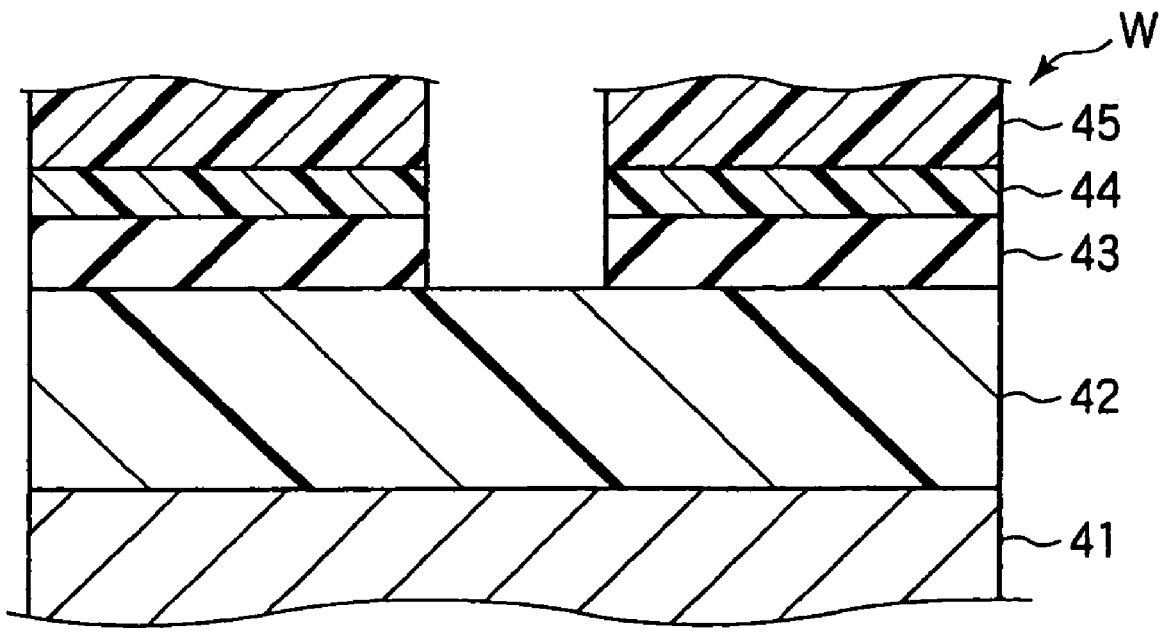

In the wafer W of the above-described structure, the BARC layer 44 and the inorganic material film 43 are etched at first with the resist film 45 used as a mask, so that the wafer W having the structure shown in FIG. 7b is obtained. Due to this etching process, the resist film 45 has a reduced thickness.

Then, the organic material film 42 in the wafer W is etched by using the resist film 45 and the inorganic material film 43 as a mask. In order therefor, the gate valve 24 of the apparatus shown in FIG. 1 is opened. Then, the wafer W of the structure shown in FIG. 7b is loaded into the apparatus 1 and is placed on the table 2 by means of a conveying arm. Next, the conveying arm is withdrawn from the apparatus, and the gate valve 24 is closed. After that, the atmosphere of the process vessel 1 is evacuated to a predetermined vacuum degree, by the vacuum pump of the evacuating apparatus 20 through the evacuating pipe 19.

Following thereto, a predetermined molecular gas and an ionization accelerating gas are introduced as a process gas into the process vessel 1, with a predetermined flow-rate ratio, which has been described above. For example, $N_2$ of 180 mL/min, $H_2$ of 180 mL/min, and Ar of 360 mL/min are introduced to the process vessel 1, and the atmosphere of the process vessel 1 is maintained at a predetermined pressure of e.g., 1.33 Pa to 133.3 Pa (10 mTorr to 1000 mTorr). While the atmosphere of the process vessel 1 is maintained at the predetermined pressure, a high-frequency power of a frequency of 40 MHz or above, e.g., 100 MHz, is supplied from the high-frequency power source 10 to the table 2. At this time, a predetermined voltage is applied to the electrode 6a of the electrostatic chuck 6 from the direct-current power source 13, so that the wafer W is attracted and held by the electrostatic chuck 6 by Coulomb force, for example.

By applying a high-frequency power to the table 2 serving as a support electrode, a high-frequency electric field is formed in the process space between the showerhead 16 serving as a counter electrode and the table 2 serving as a support electrode. Thus, the process gas that has been supplied to the process space is made into a plasma gas, so that the organic material film 42 is etched by the plasma. In this etching process, the resist film 45 initially serves as a mask. However, in the course of etching, the resist film 45 and the BARC layer 44 are etched and disappeared, and thereafter the etching process of the organic material film 42 is continued with only the inorganic material film 43 as a mask.

In this etching process, owing to the magnetic field shown in FIG. 2 formed around the process space by the ring magnets 21a and 21b in a multipole condition, a plasma confinement effect is obtained. Thus, although a high frequency, which is used in this embodiment, is prone to invite a non-uniformity in plasma density, an etching rate of the wafer W can be made uniform. The magnetic field might produce no such effect, depending on a film. In this case, an etching process can be carried out, without forming substantially no magnetic field around the process space by rotating the segment magnets 22.

When the magnetic field is formed, a more improved uniformity in the plasma process can be provided by the conductive or insulative focus ring 5 disposed around the wafer W on the table 2. That is, when the focus ring 5 is made of a conductive material such as silicon or SiC, since the focus ring area also serves as a support electrode, a plasma generation area extends to a part where the focus ring 5 is disposed. Thus, a plasma process is accelerated on the edge portion of the wafer W to thereby enhance a uniformity in etching rate. On the other hand, when the focus ring 5 is made of an insulative material such as quartz, an electric charge cannot be transferred between the focus ring 5 and the electrons or ions in plasma. Thus, a plasma confinement effect can be reinforced to thereby enhance a uniformity in etching rate.

In an etching process of an organic material film, a plasma density has a dominant impact on the process, while an ion energy makes only a small contribution to the process. On the other hand, in an etching process of an inorganic material film, both the plasma density and ion energy are important. Thus, when the organic material film 42 is etched with a use of the inorganic material film 43 as a mask, an ion energy should be lowered while preventing a decrease in plasma density, in order to increase an etching selectivity of the organic material film 42 relative to the inorganic material film 43, without degrading an etching rate of the organic material film 42. That is, when the ion energy required for etching an inorganic material is lowered, without lowering a plasma density having a dominant impact on an etching process of an organic material, only the organic material film 42 can be selectively etched with a high etching rate, even when an atomic gas such as Ar is included in the process gas. An ion energy of plasma can be indirectly grasped through a self-bias voltage of an electrode during an etching process. Thus, the organic material film 42 should be etched under a low self-bias voltage condition without lowering the plasma density, in order that the organic material film 42 is etched with a high etching selectivity, while an etching rate thereof is not deteriorated. To be specific, an absolute value of the self-bias voltage Vdc should be 500 V or below, while maintaining a plasma density of about $1\times10^{11}$ cm$^{-3}$.

Figure 8:
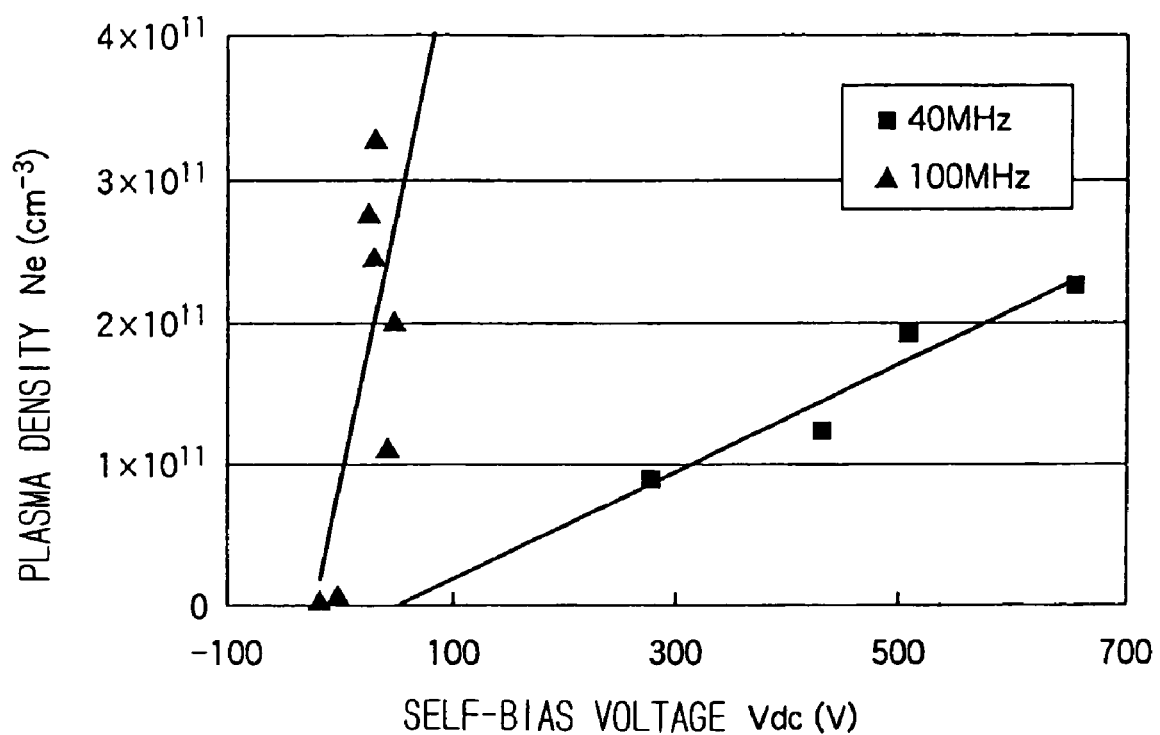
FIG. 8 is a view showing the relationship between self-bias voltage Vdc and a plasma density Ne of a plasma of gaseous argon, when a frequency of a high-frequency power is varied at 40 MHz and 100 MHz.

FIG. 8 is a view showing a relationship between the self-bias voltage Vdc and the plasma density, when a frequency of a high-frequency power was varied at 40 MHz and 100 MHz, and Ar was used as a plasma gas for evaluation, in which the self-bias voltage Vdc is shown by the axis of abscissas, and the plasma density is shown by the axis of ordinates. At each frequency, values of the plasma density Ne and the self-bias voltage Vdc were varied by varying a high-frequency power to be applied. That is, at each frequency, the more the high-frequency power to be applied was increased, the higher the plasma density Ne and the self-bias voltage Vdc became. The plasma density was measured by means of a microwave interferometer. As shown in FIG. 8, when a frequency of a high-frequency power was 40 MHz, the self-bias voltage Vdc took a value as low as 300 V, at the plasma density of $1\times10^{11}$ cm$^{-3}$, which plasma density is capable of realizing a practical etching rate of an organic material film. When a frequency of a high-frequency power was 100 MHz, the self-bias voltage Vdc was further lowered, i.e., 100 V or below at the plasma density of $1\times10^{11}$ cm$^{-3}$. Thus, with a frequency of the high-frequency power for generating the plasma being 40 MHz or above, the self-bias voltage Vdc can be made 500 V or below, which value makes it possible that the organic material film 42 is etched with least damage to the inorganic material film 43, at the plasma density of $1\times10^{11}$ cm$^{-3}$ which is practical in etching the organic material film 42. As shown in FIG. 8, the more a frequency of the high-frequency power for generating the plasma is raised, the smaller an increase in an absolute value of the self-bias voltage Vdc in accordance with the increase in plasma density becomes. Thus, a higher frequency is preferred. However, when a frequency exceeds 150 MHz, a uniformity in plasma tends to be decreased, and thus a frequency of 150 MHz or below is preferred. Practically, a frequency of about 100 MHz is preferred. A smaller absolute value, i.e., 200 V or below, of the self-bias voltage Vdc is preferred.

As shown in FIG. 5, it is possible to superpose a high-frequency power for generating the plasma and a high-frequency power for drawing ions in plasma, in order to adjust a plasma density and an ion drawing action. In this case, a frequency and power of the high-frequency power are adjusted such that an absolute value of the self-bias voltage Vdc of the table 2 serving as a support electrode is 500 V or below, preferably, 200 V or below. As shown in FIG. 6, when a high-frequency power of 40 MHz or above for generating the plasma is applied to the showerhead 16, an application of a high-frequency power for ion drawing to the table 2 serving as a support electrode is indispensable. Also in this case, a frequency and power of the high-frequency power are adjusted such that an absolute value of the self-bias voltage Vdc of the table 2 serving as a support electrode is 500 V or below, preferably, 200 V or below.

As stated above, when a frequency of the high-frequency power for generating the plasma is as high as 40 MHz or above, an absolute value of the self-bias voltage is as low as 500 V or below. Thus, even when an atomic gas such as Ar having a large etching action is used as a process gas, an energy thereof is restrained so that the gas does not exert a high etching performance on the inorganic material film 43. Rather, use of a gas that is ionized with a low energy and has a large ionization cross-section, which gas is represented by Ar gas, can provide a uniform electron density or plasma density. In this embodiment, as described above, addition of an ionization accelerating gas represented by Ar, Xe, and Kr, that is ionized from a ground state or metastable state with an ionization energy of 10 eV or below and has a maximum ionization cross-section of $2\times10^{-16}$ cm$^2$ or above, promote an ionization of the process gas. Thus, the process gas can be sufficiently ionized near the edge portion of a substrate where an electric field strength is low, whereby the process gas can be uniformly ionized as a whole. As a result, a uniform electron density or plasma density can be achieved.

Figures 9A, 9B:
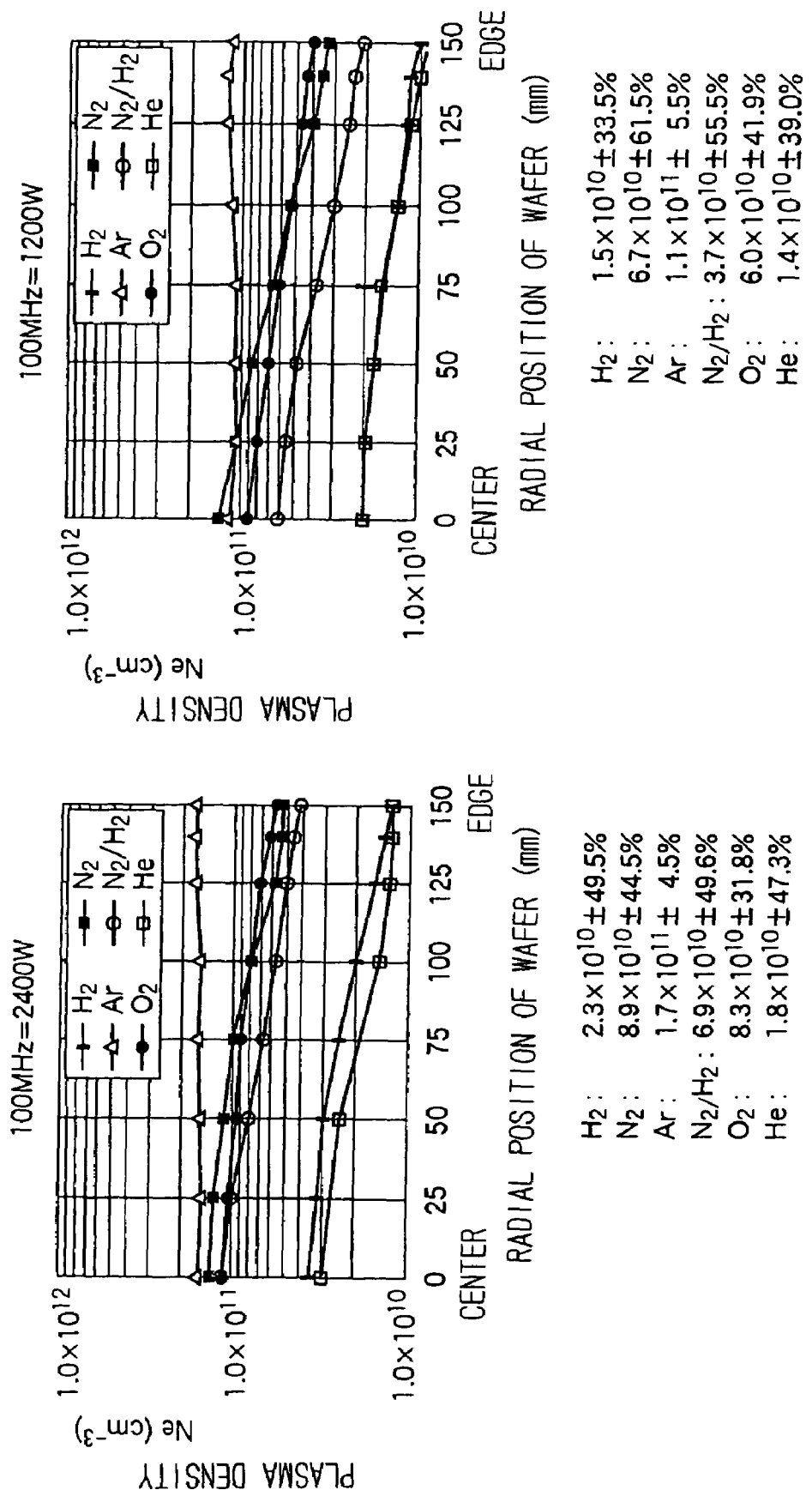
FIG. 9a is a view showing the uniformity in plasma density (electron density) of each gas.
FIG. 9b is a view showing the uniformity in plasma density (electron density) of each gas.

Experiment results demonstrating the above explanations are described below. FIGS. 9a and 9b are views each showing a uniformity in plasma density (electron density) of the respective gases. In this experiment, a relationship between a radial position of a wafer 300 mm in diameter and a plasma density was examined, when a high-frequency of 100 MHz was applied to a support electrode at different powers of 2400 W and 1200 W, under the conditions that a pressure in a process vessel was 4 Pa and a magnetic field around a wafer was 0.003 T (30 Gauss). As apparent from FIGS. 9a and 9b, a uniformity in plasma density was significantly unsatisfactory in the cases where the molecular gases of $H_2$, $N_2$, and $O_2$, and He were used. On the other hand, a substantially uniform plasma density was obtained in the case where Ar was used as an ionization accelerating gas.

Figure 10:
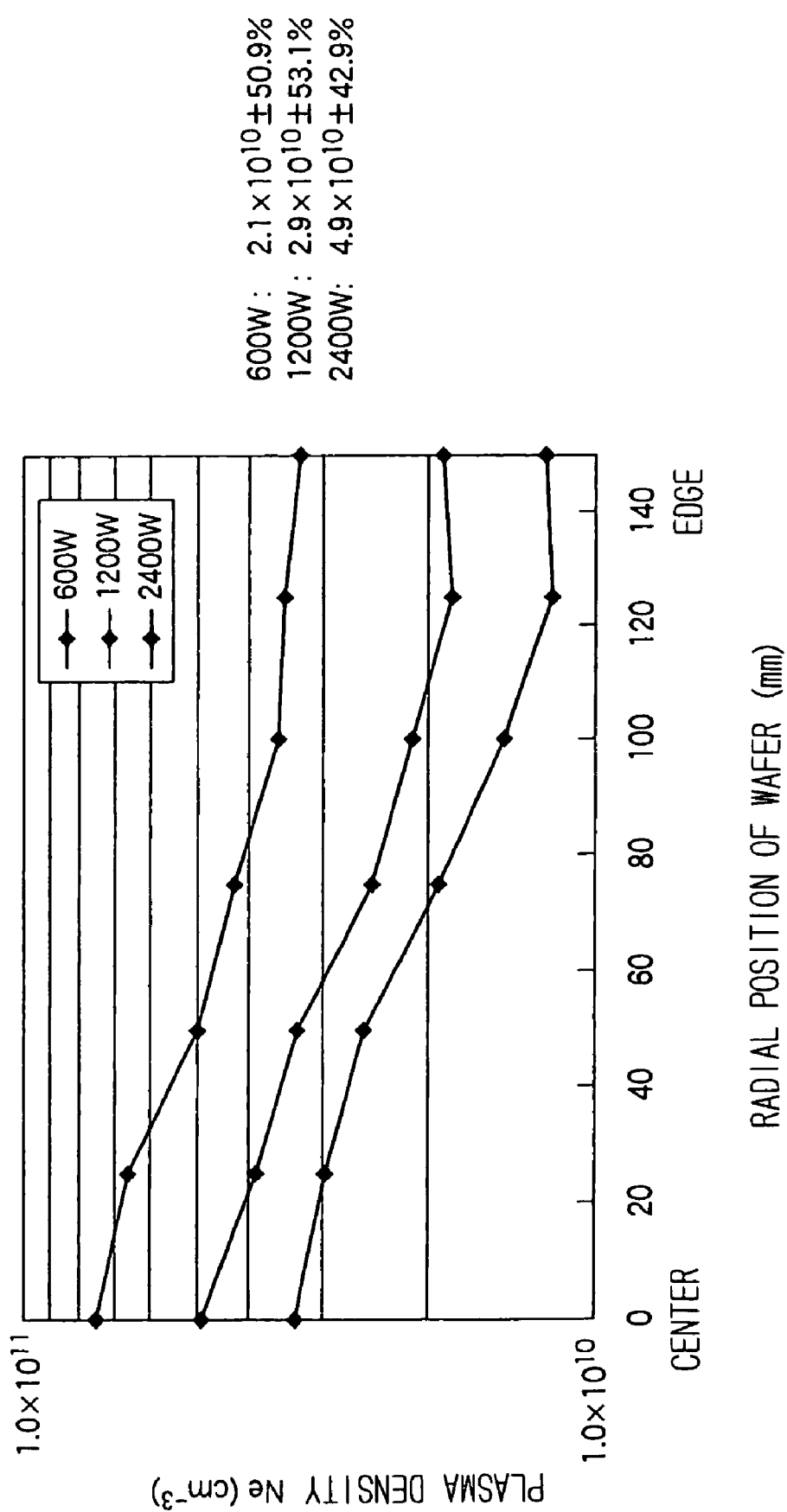
FIG. 10 is a view showing a relationship between a radial position of a wafer 300 mm in diameter and a plasma density (electron density), when $N_2/H_2$, which is a conventional process gas, is used.

FIG. 10 is a view showing a relationship between a radial position of a wafer 300 mm in diameter and a plasma density (electron density), when $N_2/H_2$ (a combination of $N_2$ and $H_2$), which is a conventional process gas, was used. In this experiment, a high-frequency power of 100 MHz was applied to a support electrode at different powers of 600 W, 1200 W, and 2400 W, under the conditions that a pressure in a process vessel was 4 Pa, a magnetic field around a wafer was 0.03 T (300 Gauss), a flow rate of $N_2$ was 180 mL/min, and a flow rate of $H_2$ was 180 mL/min. As apparent from FIG. 10, irrespective of the power, use of $N_2/H_2$ resulted in a non-uniform distribution of the plasma density, i.e., a center portion of the wafer had the increased plasma density.

FIG. 11 is a view showing a relationship between a radial position of a wafer 300 mm in diameter and plasma density when $N_2/H_2$ was used as a process gas, and when $N_2/H_2$ with Ar added thereto was used as a process gas. In this experiment, a high-frequency power of 100 MHz and 2400. W was applied to a support electrode, in which a flow rate of Ar is varied at 0 mL/min, 200 mL/min, and 400 mL/min, under the conditions that a pressure in a process vessel was 4 Pa, a magnetic field around a wafer was 0.03 T (300 Gauss), a flow rate of $N_2$ was 180 mL/min, and a flow rate of $H_2$ was 180 mL/min. As apparent from FIG. 11, when Ar was added to $N_2/H_2$, a uniformity in plasma density could be significantly enhanced.

FIG. 12 is a view showing a relationship between a radial position of a wafer 300 mm in diameter and plasma density when $NH_3$, which is a conventional process gas, was used, and when $NH_3$ with Ar added thereto was used as a process gas. In this experiment, a high-frequency power of 100 MHz and 2400 W was applied to a support electrode, in which a flow rate of Ar was varied at 0 mL/min and 240 mL/min, under the conditions that a pressure in a process vessel was 4 Pa, a magnetic field around a wafer was 0.03 T (300 Gauss), and a flow rate of $NH_3$ was 240 mL/min. As apparent from FIG. 11, when Ar was added to $NH_3$, a uniformity in plasma density could be significantly enhanced.

Next, an actual etching process of an organic material film which was carried out by using an inorganic material film as a mask is described.

Figure 13:
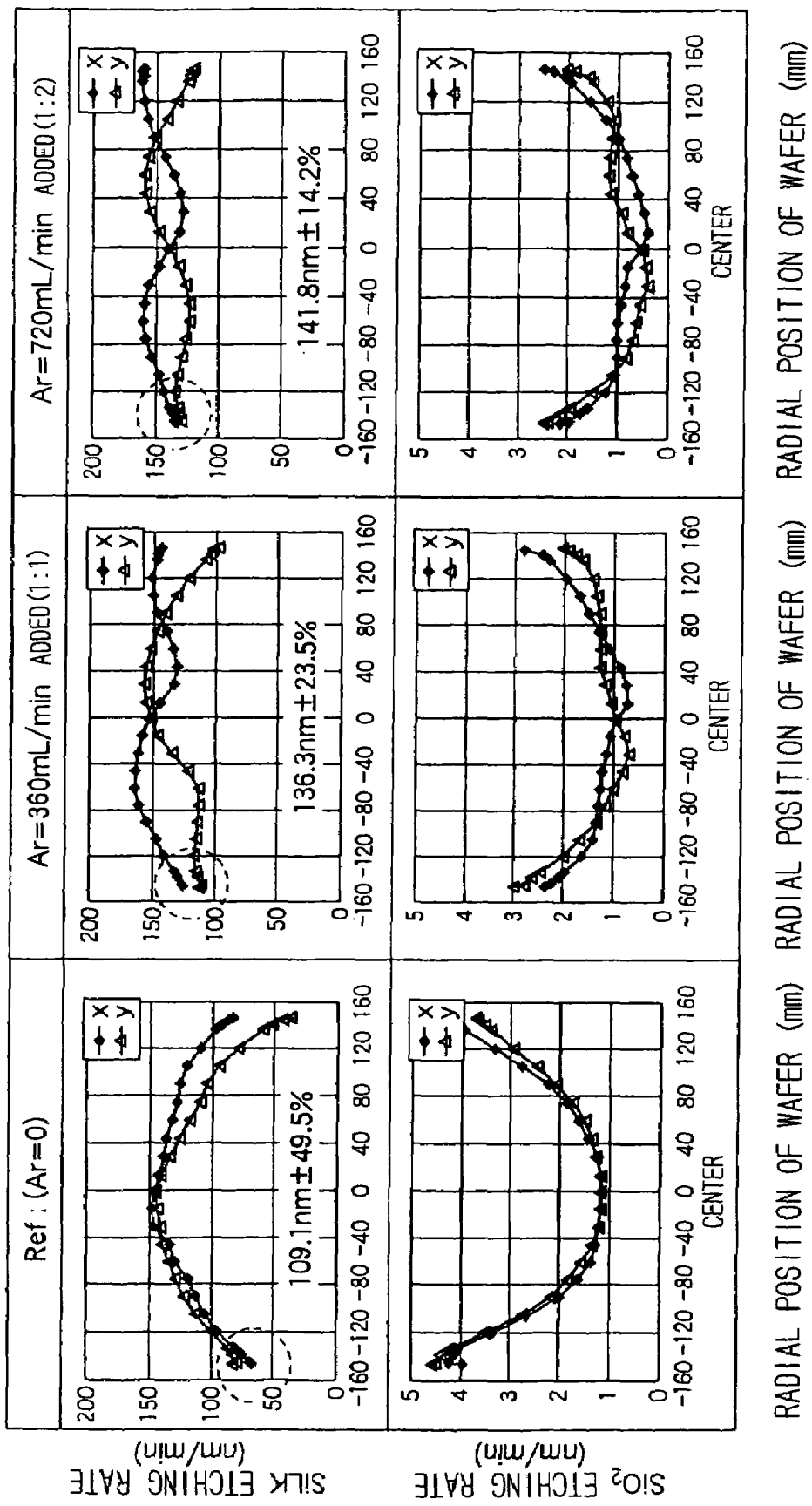
FIG. 13 is a view showing the relationship of a flow rate of Ar gas in a process gas, and etching rates of an organic material film and an inorganic material film in a radial direction of the wafer, when an organic material film is actually etched with an inorganic material film used as a mask.

In this process, a wafer 300 mm in diameter was used, with SiLK (trade name) manufactured by the Dow Chemical Co. as an organic material film, and $SiO_2$ as an inorganic material film. An etching operation was carried out by applying a high-frequency power of 100 MHz and 2400 W to a support electrode, in which a flow rate of Ar was varied at 0 mL/min, 360 mL/min, and 720 mL/min, under the conditions that a pressure in a process vessel was 4 Pa, a magnetic field around a wafer was 0.03 T (300 Gauss), a flow rate of $N_2$ was 180 mL/min, and a flow rate of $H_2$ was 180 mL/min. FIG. 13 is a view showing etching rates of the organic material film and the inorganic material film in a radial direction of the wafer. Each of two directions (x-direction and y-direction) perpendicular to each other is used as the radial direction of the wafer. As apparent from FIG. 13, addition of Ar could significantly enhance a uniformity in plasma density.

FIG. 14 is a view showing a relationship of an Ar flow rate, an etching uniformity, and an average etching rate in a radial direction of the wafer, that were measured in the above etching experiment. In FIG. 14, the Ar flow rate is shown by the axis of abscissas, while the etching uniformity and the average etching rate are shown by the axes of ordinates. As apparent from FIG. 14, it was confirmed that a uniformity in etching rate could be improved without lowering the etching rate, due to the addition of Ar. It was also confirmed that, the more the Ar flow rate was increased, the more the etching uniformity was enhanced.

Figure 15A:
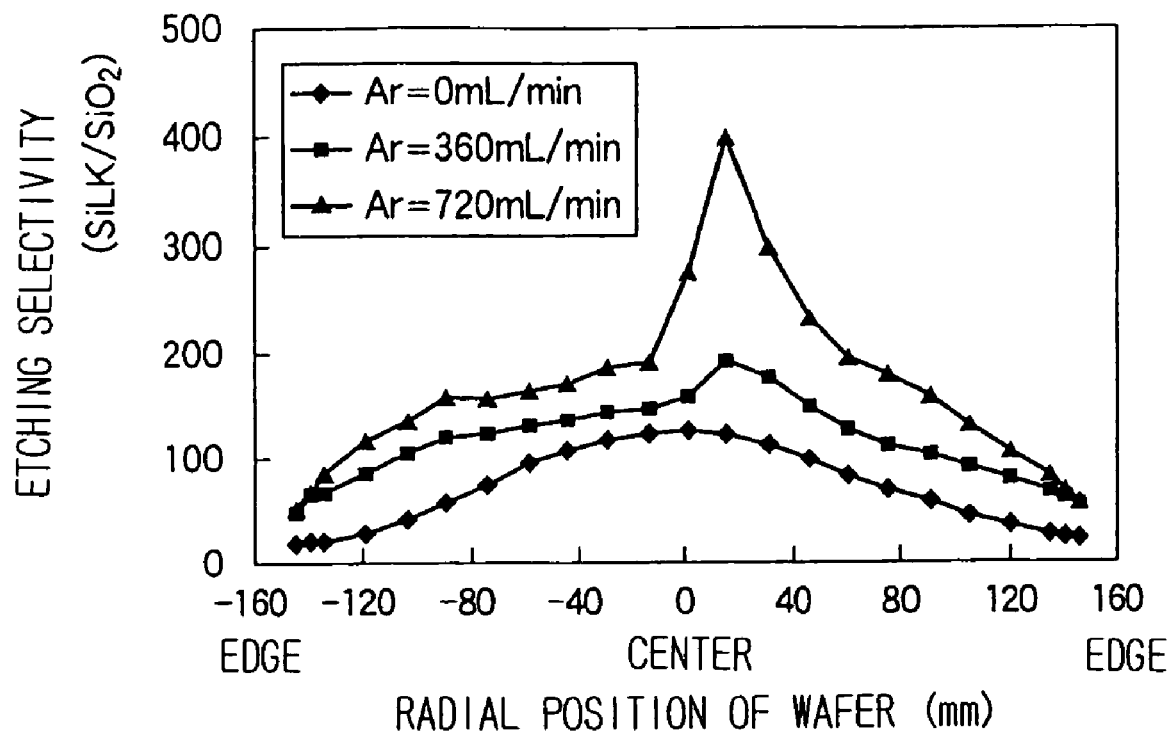
FIGS. 15a and 15b are views showing the relationship between a flow rate of Ar and an etching selectivity of SiLK relative to $SiO_2$.
Figure 15B:
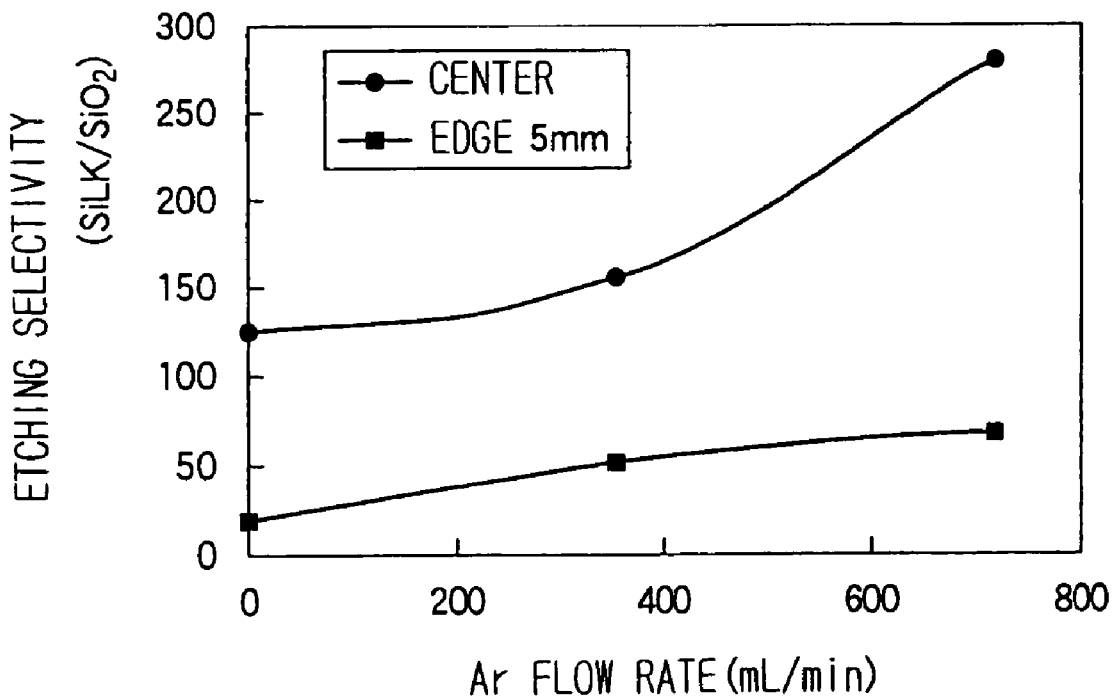

FIGS. 15a and 15b are views each showing a relationship between an Ar flow rate and an etching selectivity of SiLK relative to $SiO_2$ (SiLK/$SiO_2$; hereinafter referred to simply as "etching selectivity"), that were measured in the above etching experiment. Specifically, FIG. 15a is a view showing the etching selectivitys relative to the positions in a radial direction of the wafers, with different flow rates of Ar being 0 mL/min, 360 mL/min, and 720 mL/min. FIG. 15b is a view showing a relationship between the Ar flow rates and the etching selectivitys, measured at a center portion of the wafer and at a portion apart from the edge of the wafer by 5 mm. As apparent from FIGS. 15a and 15b, the etching selectivity was not lowered by the addition of Ar. Rather, addition of Ar improved the etching selectivity, while suppressing a damage of a facet formation of the mask.

Although the invention has been described in terms of the preferred embodiment, obviously many changes and variations are possible therein.

For example, in the above embodiment, a plurality of segment magnets of permanent magnets are annularly disposed around a process vessel so as to form a ring magnet in a multipole condition as magnetic field forming means. However, the present invention is not limited thereto, as far as the magnetic field forming means can form a magnetic field around a process space to confine therein plasma. Such a peripheral magnetic field for confining plasma is not necessarily required, and it is possible to carry out an etching process without magnetic field. Alternatively, it is possible to carry out a plasma-etching in a cross-electromagnetic field by applying a horizontal magnetic field to the process space.

In the above embodiment, the low-k film is used as an organic material film. However, other organic material films for use in a multilayer resist may be employed.

Although Ar is mainly described as an ionization accelerating gas, and Xe and Kr are taken as examples, any gas may used as far as the gas is ionized from a ground state or metastable state with an ionization energy of 10 eV or below and has a maximum ionization cross-section of $2 \times 10^{-16}$ cm$^2$ or above.

Moreover, in the above embodiment, the organic material film is etched with the inorganic material film used as a mask. Not limited thereto, the present invention can be applied to all the processes in which an organic material film should be selectively etched relative to an inorganic material film. For example, the present invention can be applied to an ashing process for removing a resist that has been used as a mask in an etching process of an inorganic material film such as $SiO_2$ formed on a substrate such as an Si wafer. That is, in the ashing process, a resist film as the organic material film should be selectively, efficiently removed, without etching the base inorganic material film as little as possible. Thus, an application of the present invention to the ashing process can provide satisfactory ashing properties.

In addition, in the above embodiment, a semiconductor wafer is used as a substrate, but the present invention can be applied to a plasma-etching process of an organic material film formed on another substrate.

The invention claimed is:

1. A method of plasma-etching an organic material film formed on a surface of a substrate with an inorganic material film used as a mask, by means of a parallel plate type plasma-etching apparatus; wherein the organic material film is plasma-etched with:

a high-frequency power of a frequency of 40 MHz or above for generating plasma; and a process gas including an ionization accelerating mono-atomic gas that is ionized from a ground state or meta-stable state with an ionization energy of 10 eV or below and has a maximum ionization cross-section of $2\times10^{-16}$ cm$^2$ or above, and a poly-atomic molecular gas, a flow-rate ratio of the ionization accelerating mono-atomic gas relative to the poly-atomic molecular gas in the process gas being 0.5 or above.

2. The method according to claim 1, wherein a plasma-etching apparatus is used, the apparatus including: a process vessel into which the process gas is supplied; and parallel plate electrodes disposed in the process vessel, the electrodes being constituted by a support electrode on which the substrate is supported, and a counter electrode that is opposed to the support electrode; and the high-frequency power for generating the plasma is applied to the support electrode.

3. The method according to claim 2, wherein a high-frequency power of a frequency of 500 kHz to 27 MHz for drawing ions is further applied to the support electrode, such that an absolute value of the self-bias voltage of the support electrode is 500 V or below.

4. The method according to claim 1, wherein a plasma-etching apparatus is used, the apparatus including: a process vessel into which the process gas is supplied; and parallel plate electrodes disposed in the process vessel, the electrodes being constituted by a support electrode on which the substrate is supported, and a counter electrode that is opposed to the support electrode; and the high-frequency power for generating the plasma is applied to the counter electrode; and a high-frequency power of a frequency of 500 kHz to 27 MHz for drawing ions is applied to the support electrode, such that an absolute value of the self-bias voltage of the support electrode is 500 V or below.

5. The method according to claim 3, wherein the process gas includes Ar as the ionization accelerating gas, and N$_2$ and H$_2$ as the molecular gas.

6. The method according to claim 3, wherein the process gas includes Ar as the ionization accelerating gas and NH$_3$ as the molecular gas.

7. The method according to claim 3, wherein a frequency of the high-frequency power for generating the plasma is 100 MHz.

8. The method according to claim 3, wherein a distance between the support electrode and the counter electrode in the parallel plate electrodes is 40 mm or below.

9. A method of plasma-etching an organic material film formed on a surface of a substrate with an inorganic material film used as a mask, by means of a parallel plate type plasma-etching apparatus; wherein the organic material film is plasma-etched with:

a high-frequency power of a frequency of 40 MHz to 150 MHz for generating plasma; and a process gas including an ionization accelerating mono-atomic gas that is ionized from a ground state or meta-stable state with an ionization energy of 10 eV or below and has a maximum ionization cross-section of $2\times10^{-16}$ cm$^2$ or above, and a poly-atomic molecular gas, a flow-rate ratio of the ionization acceleration mono-atomic gas relative to the molecular poly-atomic gas in the process gas being 0.5 or above.

10. The method according to claim 1, wherein the process gas includes Ar, N$_2$, and H$_2$, a flow-rate ratio of Ar relative to N$_2$ and H$_2$ in the process gas being 5/9 or above.

11. The method according to claim 1, wherein the process gas includes Ar and NH$_3$, a flow-rate ratio of Ar relative to NH$_3$ in the process gas being 1.0/1.0 or above.

* * * * *